(12) United States Patent
Chen et al.

(10) Patent No.: US 6,642,703 B2
(45) Date of Patent: *Nov. 4, 2003

(54) PEAK DETECTOR AND DETECTING METHOD THEREOF

(75) Inventors: Chi-Ming Chen, Hsinchu (TW); Pi-Fen Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/247,750

(22) Filed: Sep. 18, 2002

(65) Prior Publication Data

US 2003/0071608 A1 Apr. 17, 2003

Related U.S. Application Data

(63) Continuation-in-part of application No. 09/861,776, filed on May 21, 2001, now Pat. No. 6,472,861.

(30) Foreign Application Priority Data

Jul. 6, 2000 (TW) ........................................ 89111022 A

(51) Int. Cl.$^7$ ................................................ G01R 19/00
(52) U.S. Cl. ................................ 324/103 P; 324/158.1
(58) Field of Search ........................ 324/103 P, 158.1, 324/102, 127, 129; 340/658; 328/115, 151

(56) References Cited

U.S. PATENT DOCUMENTS

| | | | | |
|---|---|---|---|---|
| 3,588,722 A | * | 6/1971 | Hoelscher | 329/364 |
| 3,939,365 A | * | 2/1976 | Lindgren | 327/59 |
| 4,112,381 A | * | 9/1978 | Mortensen et al. | 327/58 |
| 6,472,861 B2 | * | 10/2002 | Chen et al. | 324/103 P |

* cited by examiner

*Primary Examiner*—Kamand Cuneo
*Assistant Examiner*—Jimmy Nguyen
(74) *Attorney, Agent, or Firm*—J.C. Patents

(57) ABSTRACT

The invention provides a peak detector having input signal triggering control and low frequency energy attenuation capability. The peak detector includes a charging unit and a discharging unit. By being triggered by a peak value detected in a received input signal by comparing voltage potential levels of the output signal of the peak detector and the received signal, the charging unit charges an electrical charge storage unit, for example, a capacitor, connected to the output terminal of the peak detector for a pre-determined charge duration in accordance with a charge pulse being in a logic high. After the pre-determined charge duration of charging operation, before being triggered by a next peak value of the received input signal, the discharging unit discharges the electrical charge storage unit for a pre-determined discharge duration in accordance with a discharge pulse being in a logic high or in accordance with a plurality of discharge pulses, which is determined by design desired.

18 Claims, 2 Drawing Sheets

PEAK DETECTOR AND DETECTING METHOD THEREOF

CROSS-REFERENCE TO RELATED APPLICATION

This application is a continuation-in-part of prior applications Ser. No. 09/861,776, filed May 21, 2001, which has now been allowed as U.S. Pat. No. 6,472,861.

BACKGROUND OF THE INVENTION

1. Field of Invention

The present invention relates to a signal detector and a detecting method thereof. More particularly, the present invention relates to a peak detector and a detecting method having input signal triggering control and low frequency energy attenuation capability

2. Description of Related Art

A peak detector is a device capable of measuring the peak value of a voltage signal. However, most peak detectors have no special faculties for distinguishing between high and low frequency signals. In real applications, the capacity of a peak detector to find the degree of signal attenuation in a local area network (LAN) or transmission medium such as cable or twisted pair is very important.

FIG. 1 is a circuit diagram of a conventional peak detector. As shown in FIG. 1, the conventional peak detector 10 comprises of a comparator 12, an NMOS transistor 14, a resistor 16, a capacitor 18 and a current source 20. The positive input terminal of comparator 12 is a terminal for receiving an input signal. The negative input terminal of comparator 12 is connected to a node point N1. The output terminal of comparator 12 is connected to the gate terminal of NMOS transistor 14. The source terminal of NMOS transistor 14 is connected to the output terminal of current source 20. The drain terminal of NMOS transistor 14 is connected to node point N1. One end of resistor 16 is connected to node point N1 while the other end of resistor 16 is connected to ground GND. One end of capacitor 18 is connected to node point N1 while the other end of capacitor 18 is again connected to ground GND. The input terminal of current source 20 is connected to a voltage source VCC.

FIG. 2A is a diagram showing an example signal waveform as measured by a conventional peak detector. FIG. 3A is a diagram showing the signal waveform shown in FIG. 2A after signal attenuation.

For example, when the peak detector 10 shown in FIG. 1 is used to detect voltage peak, the detected signal before attenuation has a waveform 30 shown in FIG. 2A. Since the peak detector 10 is incapable of distinguishing between low and high frequencies, output waveform 40 is still quite rugged even after attenuation as shown in FIG. 3A. In other words, if low frequency signals are not attenuated, signal waveform measured by the peak detector is bound to contain larger ripples.

In addition, several conventional techniques related to the design of peak detectors can be found in the following U.S. Patents.

(1) John D. Young et. al, in "High Speed Gated Peak Detector", U.S. Pat. No. 4,6620,444.
(2) Robert H. Leonowich et. al, in "Master-Slave Peak Detector", U.S. Pat. No. 5,254,881.
(3) Stan Dendinger et. al, in "Closed-Loop Peak Detector Topology", U.S. Pat. No. 5,428,307.

SUMMARY OF THE INVENTION

Accordingly, one object of the present invention is to provide a peak detector. The peak detector having input signal triggering control and low frequency energy attenuation capability. The peak detector includes a charging unit and a discharging unit. By being triggered by a peak value detected in a received input signal by comparing voltage potential levels of the output signal of the peak detector and the received signal, the charging unit charges an electrical charge storage unit, for example, a capacitor, connected to the output terminal of the peak detector for a pre-determined charge duration in accordance with a charge pulse being in a logic high. After the pre-determined charge duration of charging operation, before being triggered by a next peak value of the received input signal, the discharging unit discharges the electrical charge storage unit for a pre-determined discharge duration in accordance with a discharge pulse being in a logic high or in accordance with a plurality of discharge pulses, which is determined by design desired.

The invention provides a peak detector for receiving an input signal and output a peak signal from an output terminal. The peak detector comprising a comparator, a programmable pulse generator, a logic unit, an electrical charge storage unit, a charging unit and a discharge unit. The comparator receives the input signal and the peak signal and generates a comparing signal by comparing the input signal and the peak signal. The programmable pulse generator receives the comparing signal and generates a first pulse signal and a second pulse signal in according to the comparing signal. The logic unit receives the first pulse signal and the second pulse signal and outputs a first control signal and a second control signal. The electrical charge storage unit is coupled to the output terminal of the peak detector. The charging unit charges the electrical charge storage unit during a pre-determined charge duration in response to the first control signal to increase a voltage potential level of the peak signal. The discharge unit discharges the electrical charge storage unit during a pre-determined discharge duration in response to the second control signal to decrease the voltage potential level of the peak signal.

In the peak detector above, the pre-determined charge duration is determined in accordance with the period of the first pulse signal being in the logic high, and the pre-determined discharge duration is the period of the second pulse signal being in the logic high. A charging/discharging ratio of the peak detector is determined by (a pre-determined charge duration×the value of the first current source)/(a pre-determined discharge duration×the value of the second current source). The pre-determined charge duration is the period of the first pulse signal being in the logic high, and the pre-determined discharge duration is the period of the second pulse signal being in the logic high.

In the peak detector above, the programmable pulse generator is used for generating a first pulse signal and a second pulse signal in accordance with the comparing signal of the comparator and an external clock signal. In an example, the programmable pulse generator is triggered by the comparing signal and the pulse duration of the first pulse signal or the second pulse signal can be determined by the external clock signal. That means that the pre-determined charge duration and the pre-determined charge duration depend on the external clock signal.

For above-mentioned object of the invention, a method for detection a peak attitude of an input signal and output a peak signal is provided. The method comprises comparing voltage potential levels of the peak signal and the received signal and generating a first pulse signal; charging an electrical charge storage unit during a pre-determined charge duration in accordance with the first pulse signal being in a logic high; after the pre-determined charge duration, before being triggered by a next peak value of the input signal, generating a second pulse signal and discharging the electrical charge storage unit during a pre-determined discharge duration in accordance with the second pulse signal being in a logic high.

In the method above, a value of the voltage potential level of the peak signal being increased depends on the pre-determined charge duration. The electrical charge storage unit is charged by a first current source. A value of the voltage potential level of the peak signal being increased depends on the pre-determined charge duration and the value of the first current source.

In the method above, a value of the voltage potential level of the peak signal being increased depends on the pre-determined discharge duration and/or the value of the second current source.

In the method above, the electrical charge storage unit is charged by a first current source and is discharged by a second current source. A charge/discharge ratio is determined by (the pre-determined charge duration×the value of the first current source)/(the pre-determined discharge duration×the value of the second current source).

The peak detector comprises of a comparator, an input-trigger device, a gatewidth control block, an AND gate, a first current source, a second current source, a first switch, a second switch and a capacitor. The positive terminal of the comparator is used for receiving an input signal. The input terminal of the input-trigger device receives the output signal of the comparator. The input terminal of the gate-width control block is connected to the output terminal of the input-trigger device. One input terminal of the AND gate is connected to the output terminal of the comparator while the other input terminal of the AND gate is connected to one of the output terminals of the gate-width control block. The input terminal of the first current source is connected to a voltage source. The output terminal of the second current source is connected to a ground voltage. The ends of the first switch are connected to the output terminal of the first current source and the negative input terminal of the comparator respectively. Opening or closing of the first switch is controlled by the signal potential at the output terminal of the AND gate. The ends of the second switch are connected to the input terminal of the second current source and the negative terminal input terminal of the comparator respectively. Opening or closing of the second switch is controlled by the signal potential at the other output terminal of the gate-width control block. One end of the capacitor is connected to the negative input terminal of the comparator while the other end of the capacitor is connected to the ground voltage.

The peak detector of this invention uses simple circuits to obtain low frequency energy attenuation. Since the low frequency attenuation can also be programmed, the peak detector is able to find the actual average voltage peak. In addition, since the peak detector has a relatively simple design, the invention can replace the complicated analogue-to-digital converter conventionally used in detecting average energy attenuation after passing through an electric cable. The peak detector can also be used to measure voltage attenuation for signals passing through LAN, transmission medium such as cable or twisted pair or other related products.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
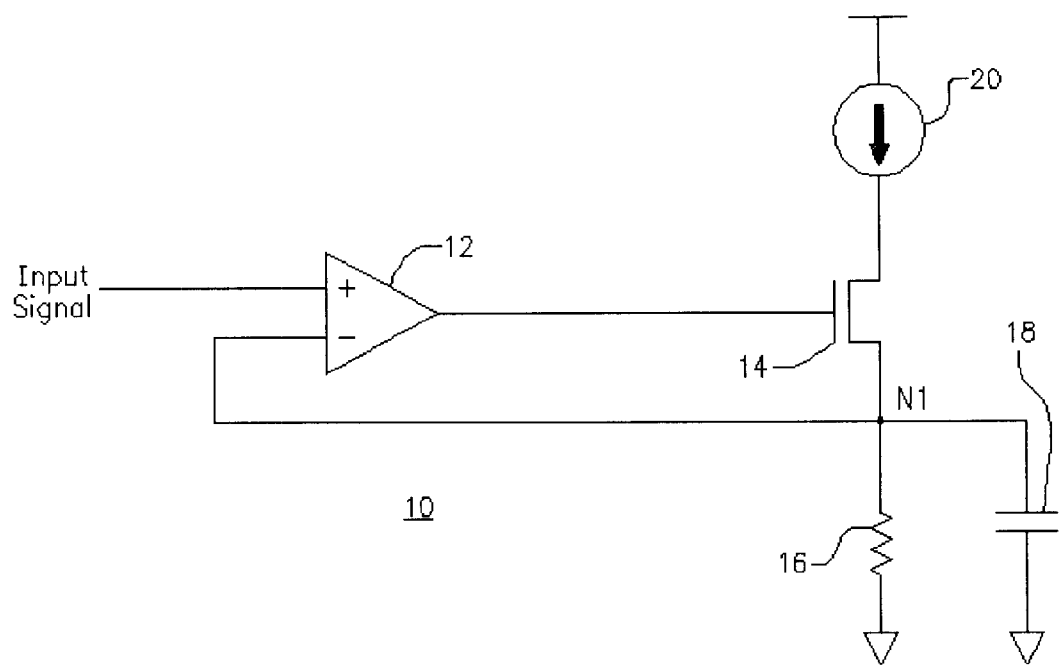
FIG. 1 is a circuit diagram of a conventional peak detector.

Reference will now be made in detail to the present preferred embodiments of the invention, examples of which are illustrated in the accompanying drawings. Wherever possible, the same reference numbers are used in the drawings and the description to refer to the same or like parts.

The invention provides a peak detector having input signal triggering control and low frequency energy attenuation capability. The peak detector includes a charging unit and a discharging unit. By being triggered by a peak value detected in a received input signal by comparing voltage potential levels of the output signal of the peak detector and the received signal, the charging unit charges an electrical charge storage unit, for example, a capacitor, connected to the output terminal of the peak detector for a pre-determined charge duration in accordance with a charge pulse being in a logic high. After the pre-determined charge duration of charging operation, before being triggered by a next peak value of the received input signal, the discharging unit discharges the electrical charge storage unit for a pre-determined discharge duration in accordance with a discharge pulse being in a logic high or in accordance with a plurality of discharge pulses, which is determined by design desired.

The peak detector of this invention uses simple circuits to obtain low frequency energy attenuation. Since the low frequency attenuation can also be programmed by adjusting the pre-determined charge duration and the pre-determined discharge duration, and/or adjusting the capability of the charging unit and the discharging unit, the peak detector is able to find the actual average voltage peak. In addition, since the peak detector has a relatively simple design, the invention can replace the complicated analogue-to-digital converter conventionally used in detecting average energy attenuation after signals passing through an electric cable. The peak detector can also be used to measure voltage attenuation for signals passing through LAN, transmission medium such as cable or twisted pair or other related products.

Figure 4:
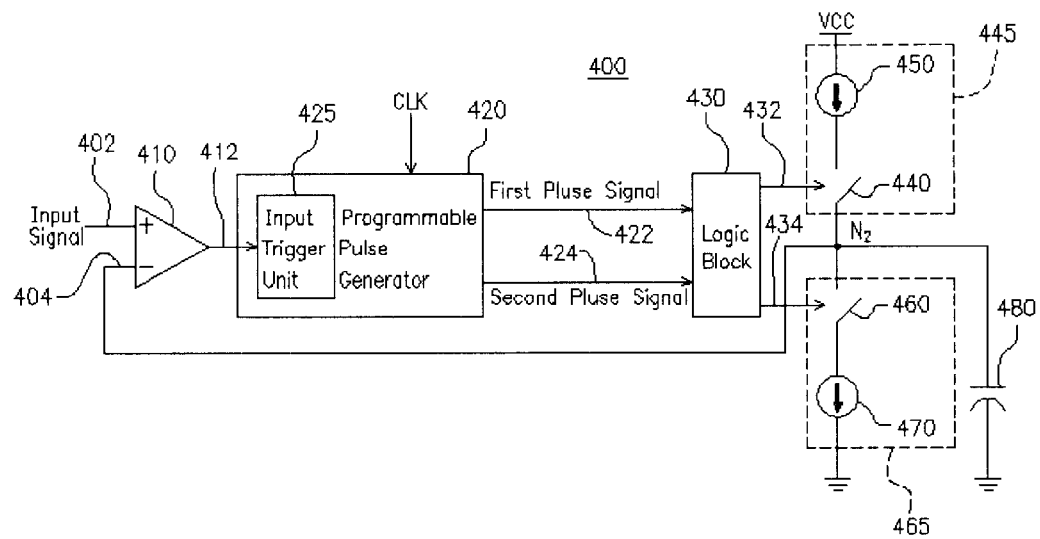
FIG. 4 is a diagram showing the circuit layout design of a peak detector according to one preferred embodiment of this invention.

FIG. 4 is a diagram showing the circuit layout design of a peak detector according to one preferred embodiment of this invention. The peak detector 400 includes a comparator 410, a programmable pulse generator 420, a logic unit 430, a charging unit 445 and a discharging unit 465 and an electrical charge storage unit 480. In a preferred embodiment, the charge unit 445 includes a first switch 440 and a first current source 450. The discharge unit 465 includes a second switch 460 and a second current source 470. The electrical charge storage unit 480 can be, for example, a capacitor 480.

The positive terminal of the comparator 410 is used for receiving an input signal 402. The negative input terminal of comparator 410 is connected to a node point N2, which is an output terminal of the peak detector 400 and the signal at node point N2 is named as a peak signal 404 of the peak detector 400. The output terminal of comparator 410 is connected to the programmable pulse generator 420 and a comparing signal 412 is therefore output to the programmable pulse generator 420. The programmable pulse generator 420 is used for generating a first pulse signal 422 and a second pulse signal 424 in accordance with the comparing signal 412 of the comparator 410. In a preferred embodiment, the programmable pulse generator 420 includes an input trigger unit 425 which is triggered by a rising edge of the comparing signal 412.

The first pulse signal 422 and the second pulse signal 424 are applied to the logic unit 430. The logic unit 430 generates a first control signal 432 and a second control signal 434 in accordance with the first pulse signal 422 and the second pulse signal 424. The first switch 440 is turned on (or "closed") in accordance with a logic status of the first control signal 430, for example, if the first control signal 432 is in a status of logic high. The second switch 460 is turned on (or "closed") in accordance with a logic status of the second control signal 434, for example, when the second control signal 434 is in a status of logic high. The logic status of the first control signal 432 and the second control signal 434 are respectively determined in accordance with the first pulse signal 422 when the first pulse signal 422 is in a logic high and the second pulse signal 424 when the second pulse signal 432 is in a logic high. The duration of the first pulse signal 422 and the second pulse signal 424 being in the logic high is determined by a design desired, which is the programmable capability of the peak detector 400.

The input terminal of first current source 450 is connected to a voltage source VCC. The output terminal of second current source 470 is connected to a ground GND. The ends of first switch 440 are connected to the output terminal of first current source 450 and the node point N2 respectively. The ends of second switch 460 are connected to the input terminal of second current source 470 and the node point N2 respectively. One end of capacitor 480 is connected to the node point N2 while the other end of capacitor 118 is connected to the ground GND. The switches 440 and 460 can be NMOS transistors, for example.

When the first switch 440 is turned on, that is closed, the capacitor 480 is charged by the first current source 450 and the voltage level of the node point N2 is then pumped up. When the second switch 460 is turned on, that is closed, the capacitor 480 is discharged by the second current source 470 and the voltage level of the node point N2 is then pulled down.

The peak detector 400 of the preferred embodiment has input signal triggering control and low frequency energy attenuation capability. By being triggered by a peak value detected in the received input signal 402 by comparing voltage potential levels of the peak signal 404 of the peak detector and the received signal 402, the charging unit 445 charges the capacitor 480 for a pre-determined charge duration in accordance with the first pulse signal 422 being in a logic high. After the pre-determined charge duration of charging operation, before being triggered by a next peak value of the received input signal 402, the discharging unit 465 discharges the capacitor 480 for a pre-determined discharge duration in accordance with the second pulse signal 424 being in a logic high. The second pulse signal 424 can include one pulse or a plurality of pulses, which is determined by design desired.

A value of the voltage potential level of the peak signal 404 being increased depends on the pre-determined charge duration and the charge capability of the charge unit 445. For example, by adjusting the duration of the first pulse signal 422 being in the logic high or by adjusting the first current source 450, the increased value of the voltage potential level of the peak signal 404 can be determined. A value of the voltage potential level of the peak signal 404 being decreased depends on the pre-determined discharge duration and the discharge capability of the discharge unit 445. For example, by adjusting the duration of the second pulse signal 424 being in the logic high or by adjusting the first current source 450, the decreased value of the voltage potential level of the peak signal 404 can be determined. In a preferred embodiment, the second pulse signal 424 can includes a plurality of pulses and the pre-determined discharge duration can be determined by the number of the pulses of the second pulse signal 424 and the total period of the pulses being in the logic high. A charge/discharge ratio is determined by (the pre-determined charge duration×the value of the first current source 450)/(the pre-determined discharge duration×the value of the second current source 470). That means the performance of the peak detector 400 can be easily controlled by adjusting the charge/discharge ratio.

In a preferred embodiment, the programmable pulse generator 420 is used for generating a first pulse signal 422 and a second pulse signal 424 in accordance with the comparing signal 412 of the comparator 410 and an external clock signal CLK, as shown in the FIG. 4. In an example, the programmable pulse generator 420 is triggered by the comparing signal 412 and the pulse duration of the first pulse signal 422 or the second pulse signal 424 can be determined by the external clock signal CLK. That means that the pre-determined charge duration and the pre-determined charge duration depend on the external clock signal CLK.

Figure 5:
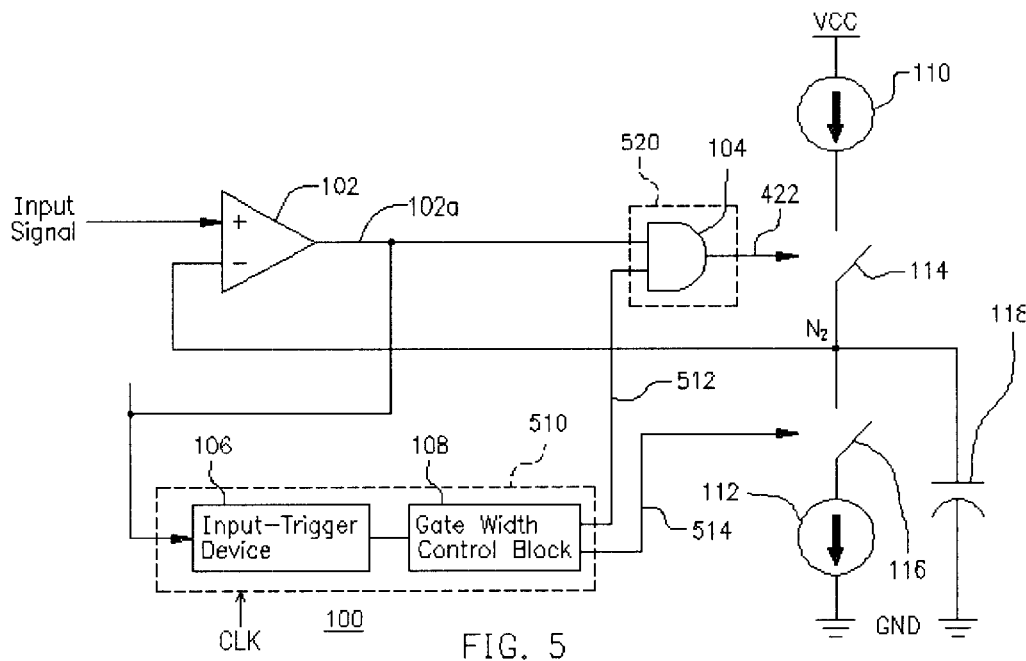
FIG. 5 is a diagram showing the circuit layout design of a peak detector according to another preferred embodiment of this invention.

FIG. 5 is a diagram showing the circuit layout design of a peak detector according to another preferred embodiment of this invention.

As shown in FIG. 5, the peak detector 100 comprises of a comparator 102, a programmable pulse generator 510, a logic unit 520, a first current source 110, a second current source 112, a first switch 114, a second switch 116 and a capacitor 118.

The programmable pulse generator 510 is used for generating a clock signal, which can be used by the logic unit. In a preferred embodiment, the logic unit 520 can be an AND gate. The programmable pulse generator 510 includes, for example, an input-trigger device 106 and a gate-width control block 108, as shown in FIG. 4. The positive terminal of the comparator 102 is used for receiving an input signal. The negative input terminal of comparator 10 is connected to a node point N2. The output terminal of comparator 102 is connected to one of the input terminals of AND gate 104.

The other input terminal of AND gate 104 is connected to the output terminal of gate-width control block 108. The input terminal of the input-trigger device 106 receives the output signal of the comparator 102. The output terminal of input-trigger device 106 is connected to the input terminal of gate-width control block 108. The input terminal of first current source 110 is connected to a voltage source VCC. The output terminal of second current source 112 is connected to a ground GND. The ends of first switch 114 are connected to the output terminal of first current source 110 and the node point N2 respectively. The other input terminal of AND gate 104 is connected to the output terminal of gatewidth control block 108. The input terminal of the input-trigger device 106 receives the output signal of the comparator 102. The output terminal of input-trigger device 106 is connected to the input terminal of gate-width control block 108. The input terminal of first current source 110 is connected to a voltage source VCC. The output terminal of second current source 112 is connected to a ground GND. The ends of first switch 114 are connected to the output terminal of first current source 110 and the node point N2 respectively.

Opening or closing of first switch 114 is controlled by the signal potential at the output terminal of AND gate 104 and the output of AND gate is proportional to input signal trigger number. The ends of second switch 116 are connected to the input terminal of second current source 112 and the node point N2 respectively. Opening or closing of second switch 116 is controlled by the signal potential at the other output terminal of gate-width control block 108. One end of capacitor 118 is connected to the node point N2 while the other end of capacitor 118 is connected to the ground GND. The switches 114 and 116 can be NMOS transistors, for example.

When the first switch 114 is turned on, that is closed, the capacitor 118 is charged by the first current source 110 and the voltage level of the node point N2 is then pumped up. When the second switch 116 is turned on, that is closed, the capacitor 118 is discharged by the second current source 112 and the voltage level of the node point N2 is then pulled down.

Figure 2A:
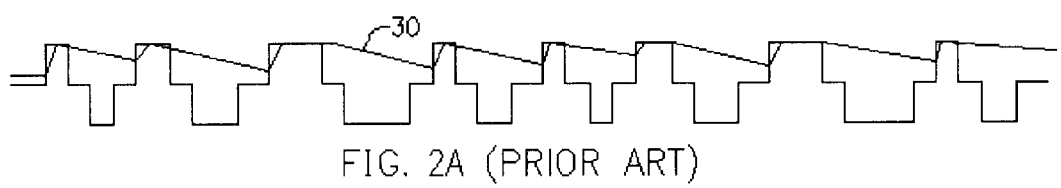
FIG. 2A, is a diagram showing an example signal waveform as measured by a conventional peak detector.
Figure 2B:
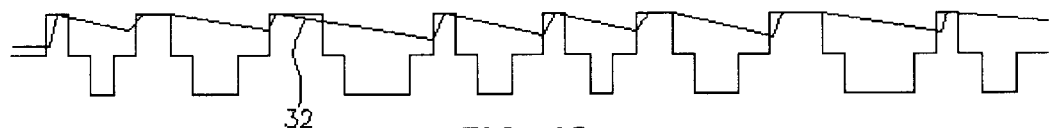
FIG. 2B is a diagram showing an example signal waveform as measured by a peak detector designed according to this invention.
Figure 3A:
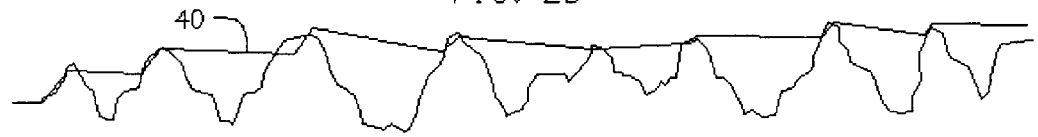
FIG. 3A is a diagram showing the signal waveform shown in FIG. 2A after signal attenuation.
Figure 3B:
FIG. 3B is a diagram showing the signal waveform shown in FIG. 2B after signal attenuation.

FIG. 2B is a diagram showing an example signal waveform as measured by a peak detector designed according to this invention. FIG. 3B is a diagram showing the signal waveform shown in FIG. 2B after signal attenuation.

For example, when the peak detector 400 shown in FIG. 4, or the peak detector 100 shown in FIG. 5, is used to detect voltage peak, the detected signal before attenuation has a waveform 32 shown in FIG. 2B. Note that the peak detector of this invention has input signal triggering control capability in addition to the capacity to control charge/discharge ratio. By controlling opening and closing of two switches charging or discharging of capacitor is under control. Hence, the peak detector can effectively distinguish high frequency from low frequency. The peak signal of the peak detector signals is increased larger in the high frequency portion than that in the low frequency portion. Therefore, the monitored signal has a smooth waveform 42 (due to the gate-width control block) as shown in FIG. 3B.

In other words, peak detector of this invention has low frequency attenuation capability. The attenuation not only can be carried out through a relatively simple circuit, the degree of attenuation is programmable too by adjusting the charge/discharge ratio. The invention is suitable for an attenuation (A) that is proportional to $\sqrt{1/f}$ (f is the frequency) such as channel attenuation so that the actual average voltage peak can be found.

The peak detector of this invention uses simple circuits to distinguish the average energy attenuation of signals passing through a cable. Since the peak detector has a relatively simple design, the invention can replace the complicated analogue-todigital converter conventionally used in detecting average energy attenuation after passing through an electric cable. In addition, the peak detector can also be used to measure voltage attenuation for signals passing through LAN, transmission medium such as cable or twisted pair or other related products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A peak detector, for receiving an input signal and output a peak signal from an output terminal, the peak detector comprising:

a comparator for receiving the input signal and the peak signal and generating a comparing signal by comparing the input signal and the peak signal;

a programmable pulse generator, for receiving the comparing signal and generating a first pulse signal and a second pulse signal in according to the comparing signal;

a logic unit, for receiving the first pulse signal and the second pulse signal and outputting a first control signal and a second control signal;

an electrical charge storage unit, coupled to the output terminal of the peak detector; and a charging unit and a discharge unit, the charging unit charging the electrical charge storage unit during a pre-determined charge duration in response to the first control signal to increase a voltage potential level of the peak signal, the discharge unit discharging the electrical charge storage unit during a pre-determined discharge duration in response to the second control signal to decrease the voltage potential level of the peak signal.

2. The peak detector of claim 1, wherein the pre-determined charge duration is determined in accordance with the period of the first pulse signal being in the logic high, and the pre-determined discharge duration is the period of the second pulse signal being in the logic high.

3. The peak detector of claim 1, wherein the electrical charge storage unit is a capacitor.

4. The peak detector of claim 1, wherein the charging unit is a first current source and the discharge unit is a second current source.

5. The peak detector of claim 4, wherein a charging/discharging ratio of the peak detector being determined by (a pre-determined charge duration×the value of the first current source)/(a pre-determined discharge duration×the value of the second current source), where the pre-determined charge duration is the period of the first pulse signal being in the logic high, and the pre-determined discharge duration is the period of the second pulse signal being in the logic high.

6. The peak detector of claim 1, the programmable pulse generator further receiving an external clock signal and generating the first pulse signal and the second pulse signal in according to the comparing signal and the external clock signal.

7. The peak detector of claim 6, the programmable pulse generator being triggered by the comparing signal, the pre-determined charge duration and the predetermined discharge duration being determined by the external clock signal.

8. A method for detection a peak attitude of an input signal and output a peak signal, the method comprising:

comparing voltage potential levels of the peak signal and the received signal and generating a first pulse signal;

charging an electrical charge storage unit during a pre-determined charge duration in accordance with the first pulse signal being in a logic high;

after the pre-determined charge duration, before being triggered by a next peak value of the input signal, generating a second pulse signal and discharging the electrical charge storage unit during a first pre-determined discharge duration in accordance with the second pulse signal being in a logic high.

9. The method of claim 8, wherein the step of comparing the voltage potential levels of the peak signal and the received signal is triggered by a peak value of the input signal.

10. The method of claim 8, wherein a value of the voltage potential level of the peak signal being increased depends on the pre-determined charge duration.

11. The method of claim 8, wherein the electrical charge storage unit is charged by a first current source.

12. The method of claim 11, wherein a value of the voltage potential level of the peak signal being increased depends on the pre-determined charge duration and the value of the first current source.

13. The method of claim 8, wherein a value of the voltage potential level of the peak signal being decreased depends on the first pre-determined discharge duration.

14. The method of claim 8, wherein the electrical charge storage unit is discharged by a second current source.

15. The method of claim 13, wherein a value of the voltage potential level of the peak signal being increased depends on the first pre-determined discharge duration and the value of the second current source.

16. The method of claim 8, wherein the electrical charge storage unit is charged by a first current source and is discharged by a second current source, wherein a charge/discharge ratio is determined by (the pre-determined charge duration×the value of the first current source)/(the first pre-determined discharge duration×the value of the second current source).

17. The method of claim 8, wherein after the second pulse signal being generated and discharging the electrical charge storage unit during the first pre-determined discharge duration in accordance with the second pulse signal being in a logic high, a third pulse signal being generated and discharging the electrical charge storage unit during a second pre-determined discharge duration in accordance with the third pulse signal being in a logic high.

18. The method of claim 17, wherein the electrical charge storage unit is charged by a first current source and is discharged by a second current source, wherein a charge/discharge ratio is determined by (the pre-determined charge duration×the value of the first current source)/((the first pre-determined discharge duration+the second pre-determined discharge duration)×the value of the second current source).

* * * * *